(12) United States Patent
Friedrich et al.

(10) Patent No.: US 9,664,748 B2
(45) Date of Patent: May 30, 2017

(54) SYSTEMS AND METHODS FOR PROVIDING SIGNAL ENCODING REPRESENTATIVE OF A SIGNATURE REGION IN A TARGET

(71) Applicant: Allegro MicroSystems, LLC, Worcester, MA (US)

(72) Inventors: Andreas P. Friedrich, Metz-Tessy (FR); Andrea Foletto, Annecy (FR); Jay M. Towne, Bow, NH (US); Michael Morris, Deerfield, NH (US); Eric Shoemaker, Pembroke, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 298 days.

(21) Appl. No.: 14/306,722

(22) Filed: Jun. 17, 2014

(65) Prior Publication Data

US 2014/0375312 A1 Dec. 25, 2014

Related U.S. Application Data

(60) Provisional application No. 61/837,332, filed on Jun. 20, 2013.

(51) Int. Cl.
*G01R 33/02* (2006.01)
*G01R 33/06* (2006.01)
(Continued)

(52) U.S. Cl.
CPC .......... *G01R 33/02* (2013.01); *G01D 5/2457* (2013.01); *G01D 5/24461* (2013.01);
(Continued)

(58) Field of Classification Search
CPC ........ G01R 33/02; G01R 33/07; G01R 33/09; G01R 33/093; G01R 33/0041;
(Continued)

(56) References Cited

U.S. PATENT DOCUMENTS

| 3,582,932 A | 6/1971 | Chapman |
| 3,944,792 A | 3/1976 | Sautner |

(Continued)

FOREIGN PATENT DOCUMENTS

| EP | 0 033 902 | 8/1981 |
| EP | 0 875 733 A2 | 11/1998 |

(Continued)

OTHER PUBLICATIONS

PCT Search Report and Written Opinion of the ISA dated Oct. 6, 2014; for PCT Pat. App. No. PCT/US2014/042669; 9 pages.
(Continued)

*Primary Examiner* — Tung X Nguyen
*Assistant Examiner* — Lee Rodak
(74) *Attorney, Agent, or Firm* — Daly, Crowley, Mofford & Durkee, LLP

(57) ABSTRACT

A magnetic field sensor and associated method provide an output signal with first and second different pulses with first and second different pulse widths indicative of first and second different directions of rotation of a moving target. The magnetic field sensor also includes third pulses with an identifiable encoding to indicate when a signature region in the moving target proximate to the magnetic field sensor passes by the magnetic field sensor. The third pulses each comprise respective state transitions and each comprise respective pulse widths with respective fixed predetermined time durations.

22 Claims, 6 Drawing Sheets

(51) Int. Cl.
| | | |
|---|---|---|
| *G01R 33/07* | (2006.01) | |
| *G01P 3/48* | (2006.01) | |
| *G01D 5/244* | (2006.01) | |
| *G01R 33/09* | (2006.01) | |
| *G01P 3/487* | (2006.01) | |
| *G01P 3/488* | (2006.01) | |
| *G01P 13/04* | (2006.01) | |
| *G01D 5/245* | (2006.01) | |
| *G01P 3/489* | (2006.01) | |

(52) U.S. Cl.
CPC ............ *G01P 3/4802* (2013.01); *G01P 3/487* (2013.01); *G01P 3/488* (2013.01); *G01P 3/489* (2013.01); *G01P 13/045* (2013.01); *G01R 33/07* (2013.01); *G01R 33/09* (2013.01)

(58) Field of Classification Search
CPC ............... G01R 33/095; G01R 33/096; G01D 5/24461; G01D 5/2457; G01D 5/145; G01D 5/147; G01D 5/2451; G01D 5/142; G01D 5/2448; G01D 5/14; G01D 5/24438; G01D 5/2492; G01P 3/48; G01P 3/487; G01P 3/488; G01P 3/489; G01P 13/045; G01P 3/481; G01P 3/4082; G01P 3/44; G01P 3/443; G01P 3/48; G01P 3/486; G01P 13/04; G01P 21/02; G01P 1/00; G01P 3/4802; F02P 7/0675; F02P 7/0775; F02D 41/009; F02D 2250/06; G01M 15/00
USPC .............. 324/207.13, 207.2, 207.24, 207.25, 324/207.23, 165, 173, 174, 324/207.11–207.26, 244–247, 249, 324/251–259, 260; 73/114.26–114.28; 327/10, 20
See application file for complete search history.

(56) References Cited

U.S. PATENT DOCUMENTS

| | | | |
|---|---|---|---|
| 4,262,251 A * | 4/1981 | Fujishiro | F02P 17/02 324/166 |
| 4,553,427 A * | 11/1985 | Kuraoka | F02P 5/1506 123/406.54 |
| 4,628,269 A * | 12/1986 | Hunninghaus | F02P 7/0675 327/115 |
| 5,493,219 A | 2/1996 | Makino et al. | |
| 5,650,719 A | 7/1997 | Moody et al. | |
| 5,694,038 A | 12/1997 | Moody et al. | |
| 5,729,130 A | 3/1998 | Moody et al. | |
| 5,917,320 A | 6/1999 | Scheller et al. | |
| 6,091,239 A | 7/2000 | Vig et al. | |
| 6,232,768 B1 | 5/2001 | Moody et al. | |
| 6,242,908 B1 | 6/2001 | Scheller et al. | |
| 6,288,567 B1 | 9/2001 | Fink | |
| 6,297,627 B1 | 10/2001 | Towne et al. | |
| 6,320,374 B1 * | 11/2001 | Schroeder | G01B 7/30 324/165 |
| 6,346,808 B1 * | 2/2002 | Schroeder | G01D 5/145 324/207.21 |
| 6,525,531 B2 | 2/2003 | Forrest et al. | |
| 6,542,847 B1 | 4/2003 | Lohberg et al. | |
| 6,687,644 B1 | 2/2004 | Zinke et al. | |
| 6,693,419 B2 | 2/2004 | Stauth et al. | |
| 6,815,944 B2 | 11/2004 | Vig et al. | |
| 6,968,484 B2 | 11/2005 | Hummel | |
| 7,026,808 B2 | 4/2006 | Vig et al. | |
| 7,184,876 B2 * | 2/2007 | Teulings | F02D 41/009 123/476 |
| 7,199,579 B2 | 4/2007 | Scheller et al. | |
| 7,319,418 B2 | 1/2008 | Fink | |
| 7,362,094 B2 | 4/2008 | Voisine et al. | |
| 7,466,123 B2 | 12/2008 | Kato et al. | |
| 7,982,454 B2 | 7/2011 | Fernandez et al. | |
| 2003/0222637 A1 | 12/2003 | Stauth et al. | |
| 2004/0095130 A1 * | 5/2004 | Yokotani | G01D 5/147 324/207.21 |
| 2005/0194970 A1 | 9/2005 | Scheller et al. | |
| 2006/0059702 A1 * | 3/2006 | Hammerl | G01D 5/2457 33/706 |
| 2007/0164732 A1 | 7/2007 | Voisine et al. | |
| 2008/0158039 A1 | 7/2008 | Kassner | |
| 2009/0058404 A1 * | 3/2009 | Kurumado | G01D 5/145 324/207.25 |
| 2010/0072988 A1 * | 3/2010 | Hammerschmidt | H03M 1/28 324/207.25 |
| 2013/0082693 A1 * | 4/2013 | Boehl | G01B 7/30 324/207.25 |
| 2014/0084903 A1 | 3/2014 | Vig et al. | |
| 2014/0084904 A1 | 3/2014 | Vig et al. | |

FOREIGN PATENT DOCUMENTS

| | | | |
|---|---|---|---|
| EP | 0 875 733 A3 | 11/1998 | |
| GB | 2 309 310 A | 7/1997 | |
| WO | WO 85/00551 * | 5/1985 | ............... H03K 5/19 |
| WO | WO 03/069358 A2 | 8/2003 | |
| WO | WO 03/069358 A3 | 8/2003 | |

OTHER PUBLICATIONS

PCT International Preliminary Report on Patentability and Written Opinion of the ISA dated Dec. 30, 2015; For PCT App. No. PCT/US2014/042669; 6 pages.
Allegro Data Sheet; "ATS694LSG Chopper Stabilized Position Sensor IC With Speed and Direction Output;" dated Nov. 27, 2012; 18 pages.
Fericean; "New Noncontacting Inductive Analog Proximity and Inductive Linear Displacement Sensors for Industrial Automation;" IEEE Sensors Journal, vol. 7, No. 11; Nov. 2007; pp. 1538-1545.
U.S. Appl. No. 11/768,370, filed Jun. 26, 2007.
Communication pursuant to Rules 161(1) and 162 EPC dated Jan. 11, 2016 for European Application No. 14739308.6; 2 pages.
Response to Rules 161(1) and 162 EPC with amended claims filed Jul. 14, 2016 for European Application No. 14739308.6; 16 pages.

* cited by examiner

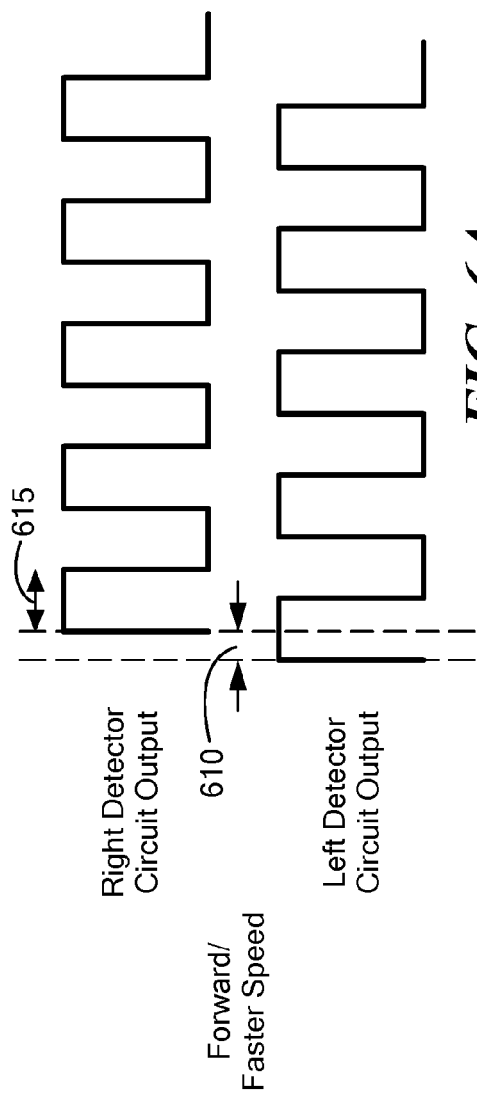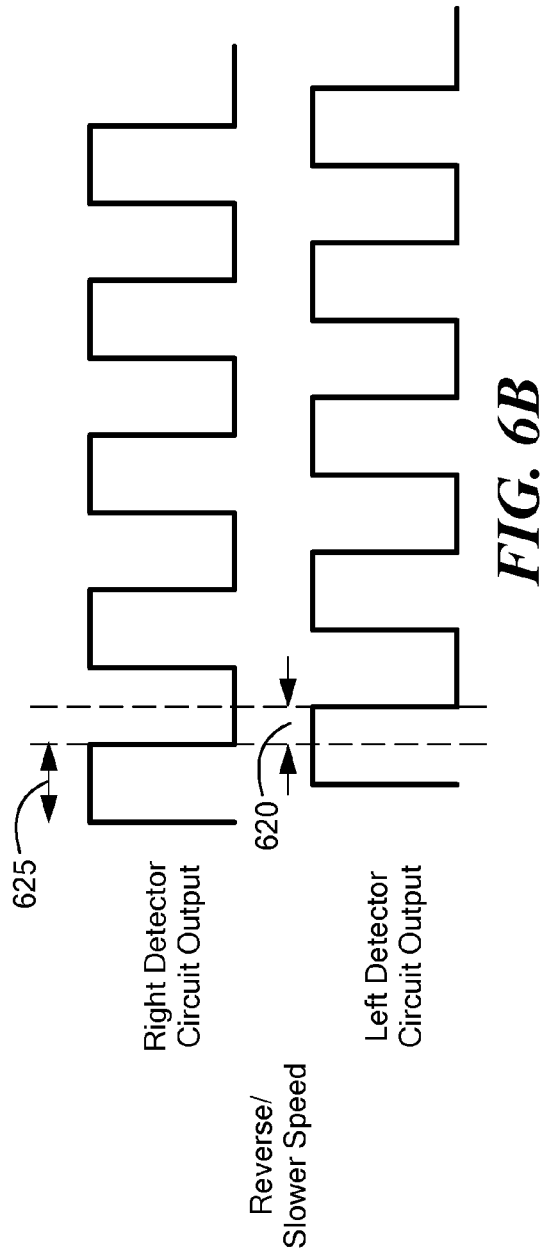

SYSTEMS AND METHODS FOR PROVIDING SIGNAL ENCODING REPRESENTATIVE OF A SIGNATURE REGION IN A TARGET

CROSS REFERENCE TO RELATED APPLICATIONS

This application claims the benefit under 35 U.S.C. §119 (e) of U.S. Provisional Application No. 61/837,332 filed Jun. 20, 2013, which application is incorporated herein by reference in its entirety.

STATEMENT REGARDING FEDERALLY SPONSORED RESEARCH

Not Applicable

FIELD OF THE INVENTION

This invention relates generally to integrated circuits and, more particularly, to integrated circuits for detecting movement, e.g., rotation, of a ferromagnetic object or a magnetic object.

BACKGROUND

Proximity detectors for detecting ferromagnetic articles and/or magnetic articles are known. The magnetic field associated with the ferromagnetic article or magnet is detected by a magnetic field transducer, such as a Hall element or a magnetoresistance element, which provides a signal (i.e., a magnetic field signal) proportional to a detected magnetic field. In some arrangements, the magnetic field signal is an electrical signal.

One application for a proximity detector is to detect the approach and retreat of each tooth of a rotating ferromagnetic gear. In some arrangements, a ring magnet having magnetic regions (permanent or hard ferromagnetic material) with alternating polarity is coupled to the ferromagnetic gear or is used by itself and the magnetic field sensor is responsive to approach and retreat of the magnetic regions of the ring magnet. The proximity detector processes the magnetic field signal to generate an output signal that changes state each time the magnetic field signal either reaches a peak (positive or negative peak) or crosses a threshold level. Therefore, the output signal, which has an edge rate or period, is indicative of a speed of rotation of the ferromagnetic gear or of the ring magnet.

In one type of proximity detector, sometimes referred to as a peak-to-peak percentage detector (or threshold detector), a threshold level is equal to a percentage of the peak-to-peak magnetic field signal. One such peak-to-peak percentage detector is described in U.S. Pat. No. 5,917,320 entitled "Detection of Passing Magnetic Articles While Periodically Adapting Detection Threshold" and assigned to the assignee of the present invention.

Another type of proximity detector, sometimes referred to as a slope-activated detector or as a peak-referenced detector, is described in U.S. Pat. No. 6,091,239 entitled "Detection Of Passing Magnetic Articles With a Peak Referenced Threshold Detector," which is assigned to the assignee of the present invention. Another such peak-referenced proximity detector is described in U.S. Pat. No. 6,693,419, entitled "Proximity Detector," which is assigned to the assignee of the present invention and incorporated herein by reference. Another such peak-referenced proximity detector is described in U.S. Pat. No. 7,199,579, entitled "Proximity Detector," which is assigned to the assignee of the present invention and incorporated herein by reference. In the peak-referenced proximity detector, the threshold signal differs from the positive and negative peaks (i.e., the peaks and valleys) of the magnetic field signal by a predetermined amount. Thus, in this type of proximity detector, the output signal changes state when the magnetic field signal comes away from a peak or valley by the predetermined amount.

Some proximity detectors use two types of detectors and switch between the two types, for example, as described in U.S. patent application Ser. No. 11/333,522, filed Jan. 13, 2006, entitled "Method and Apparatus for Magnetic Article Detection," which is assigned to the assignee of the present invention and incorporated herein by reference.

It should be understood that, because the above-described peak-to-peak percentage detector and the above-described peak-referenced detector both have circuitry that can identify the positive and negative peaks of a magnetic field signal, the peak-to-peak percentage detector and the peak-referenced detector both include a peak detector circuit adapted to detect a positive peak and a negative peak of the magnetic field signal. Each, however, uses the detected peaks in different ways.

In order to accurately detect the positive and negative peaks of a magnetic field signal, the proximity detector is capable of tracking at least part of the magnetic field signal. To this end, typically, one or more digital-to-analog converters (DACs) can be used to generate a tracking signal, which tracks the magnetic field signal. For example, in the above-referenced U.S. Pat. Nos. 5,917,320 and 6,091,239, two DACs are used; one (PDAC) to detect the positive peaks of the magnetic field signal and the other (NDAC) to detect the negative peaks of the magnetic field signal.

Some types of proximity detectors perform one or more types of calibration, typically at a time near to start up or power up of the proximity detector. During one type of calibration, in particular for a peak-to-peak percentage detector (threshold detector), the above-described threshold level is determined. Immediately upon startup, the threshold may have a value that results in an improper output from the proximity detector.

In some applications, the ferromagnetic gear or the ring magnet includes a "signature structure" (also referred to herein as a "signature region"), which is different than other parts of the ferromagnetic gear or ring magnet. During operation, i.e., when the ferromagnetic gear or ring magnet is rotating, the signature structure passes near to the magnetic field sensor, resulting in a "signature region" in the magnetic field signal generated by the magnetic field sensor. In some applications, it may be desirable to provide an affirmative indication of the signature region.

SUMMARY

The present invention provides a magnetic field sensor and related technique that generates an output signal with an affirmative indication of a signature region is a ferromagnetic rotating (or otherwise moving) object, for example, a gear, or in a magnetic rotating (or otherwise moving) object, for example, a ring magnet.

In accordance with an example useful for understanding an aspect of the present invention, a magnetic field sensor includes two or more magnetic field sensing elements responsive to a moving target having a signature region, wherein the two or more magnetic field sensing elements are configured to generate at least two magnetic field signals. The magnetic field sensor can also include at least two detector circuits coupled to the two or more magnetic field sensing elements. The at least two detector circuits are configured to generate a respective at least two detector signals. Each detector signal has respective state transitions with respective rates indicative of a rate of movement of the target. The state transitions of the at least two detector signals have a relative phase indicative of a direction of movement of the target. The magnetic field sensor can also include an output protocol processor coupled to the at least two detector circuits and configured to generate a magnetic field sensor output signal, The magnetic field sensor output signal has a plurality of pulses with respective pulse widths, wherein first pulses with first pulse widths with a first time duration are indicative of the target moving in a first direction, wherein second pulses with second pulse widths with a second different time duration are indicative of the target moving in a second different direction, and wherein third pulses with identifiable encoding are indicative of the signature region passing by the magnetic field sensor.

In some embodiments of the above magnetic field sensor, the magnetic field sensor can include one or more of the following aspects in any combination.

In some embodiments of the above magnetic field sensor, the third pulses have third pulse widths with a third different time duration that are indicative of the signature region passing by the magnetic field sensor.

In some embodiments of the above magnetic field sensor, the target has at least one of a plurality of ferromagnetic teeth and a plurality of valleys, each with a respective width, or a plurality of north pole magnetic regions and a plurality of south pole magnetic regions, each with a respective width, and wherein the signature region comprises a signature structure comprised of at least one signature ferromagnetic tooth, at least one valley, at least one north pole magnetic region, or at least one south pole magnetic region, with a width different than widths of the plurality of ferromagnetic teeth, or the widths of plurality of valleys, or the widths of the plurality of north pole magnetic regions, or the widths of the plurality of south pole magnetic regions.

In some embodiments of the above magnetic field sensor, positions of the third pulses within the plurality of pulses are determined according to threshold crossings of at least one of the magnetic field signals.

In some embodiments of the above magnetic field sensor, positions of the third pulses within the plurality of pulses are determined according to a time prediction of where one of the first pulses or one of the second pulses would occur if the signature region were not provided.

In some embodiments of the above magnetic field sensor, positions of the third pulses within the plurality of pulses are determined according to a position of a next one of the first pulses or a next one of the second pulses that would occur after the signature region passes by the magnetic field sensor.

In some embodiments of the above magnetic field sensor, the third pulses are spaced an equal distance in time between the first pulses or the second pulses and are substantially centered with respect to the signature region.

In some embodiments of the above magnetic field sensor, the third pulses are spaced an unequal distance in time between the first pulses or the second pulses and are not centered with respect to the signature region.

In some embodiments of the above magnetic field sensor, positions of the third pulses within the plurality of pulses are determined according to phase differences between two of the at least two magnetic field signals.

In some embodiments, the above magnetic field sensor further comprises a counter for counting a quantity of the first pulses or a quantity of the second pulses between two or more of the third pulses to identify a passing or a failing condition.

In accordance with another example useful for understanding another aspect of the present invention, a method used in a magnetic field sensor, includes generating at least two magnetic field signals with two or more magnetic field sensing elements responsive to a moving target having a signature region. The method can also include generating a respective at least two detector signals with at least two detector circuits coupled to the two or more magnetic field sensing elements, wherein each detector signal has respective state transitions with respective rates indicative of a rate of movement of the target, and wherein the state transitions of the at least two detector signals have a relative phase indicative of a direction of movement of the target. The method can also include generating a magnetic field sensor output signal with an output protocol processor coupled to the at least two detector circuits, wherein the magnetic field sensor output signal has a plurality of pulses with respective pulse widths, wherein first pulses with first pulse widths with a first time duration are indicative of the target moving in a first direction, wherein second pulses with second pulse widths with a second different time duration are indicative of the target moving in a second different direction, and wherein third pulses with identifiable encoding are indicative of the signature region passing by the magnetic field sensor.

In some embodiments of the above method, the method can include one or more of the following aspects in any combination.

In some embodiments of the above method, the third pulses have third pulse widths with a third different time duration that are indicative of the signature region passing by the magnetic field sensor.

In some embodiments of the above method, the target has at least one of a plurality of ferromagnetic teeth and a plurality of valleys, each with a respective width, or a plurality of north pole magnetic regions and a plurality of south pole magnetic regions, each with a respective width, and wherein the signature region comprises a signature structure comprised of at least one signature ferromagnetic tooth, at least one valley, at least one north pole magnetic region, or at least one south pole magnetic region, with a width different than widths of the plurality of ferromagnetic teeth, or the widths of plurality of valleys, or the widths of the plurality of north pole magnetic regions, or the widths of the plurality of south pole magnetic regions.

In some embodiments of the above method, positions of the third pulses within the plurality of pulses are determined according to threshold crossings of at least one of the magnetic field signals.

In some embodiments of the above method, positions of the third pulses within the plurality of pulses are determined according to a time prediction of where one of the first pulses or one of the second pulses would occur if the signature region were not provided.

In some embodiments of the above method, positions of the third pulses within the plurality of pulses are determined according to a position of a next one of the first pulses or a next one of the second pulses that would occur after the signature region passes by the magnetic field sensor.

In some embodiments of the above method, the third pulses are spaced an equal distance in time between the first pulses or the second pulses and are substantially centered with respect to the signature region.

In some embodiments of the above method, the third pulses are spaced an unequal distance in time between the first pulses or the second pulses and are not centered with respect to the signature region.

In some embodiments of the above method, positions of the third pulses within the plurality of pulses are determined according to phase differences between two of the at least two magnetic field signals.

In some embodiments, the above method further comprises:

counting a quantity of the first pulses or a quantity of the second pulses between two or more of the third pulses; and identifying a passing or a failing condition in accordance with the counted quantity.

BRIEF DESCRIPTION OF THE DRAWINGS

The foregoing features of the invention, as well as the invention itself may be more fully understood from the following detailed description of the drawings, in which:

FIG. 6A is a pictorial showing exemplary left and right channel detector output signals (see, e.g., signals 46a and 46b of FIG. 5) of forward target object rotation according to an embodiment.

FIG. 6B is a pictorial showing exemplary left and right channel detector output signals (see, e.g., signals 46a and 46b of FIG. 5) of reverse target object rotation according to an embodiment.

DETAILED DESCRIPTION OF THE INVENTION

Figure 1:
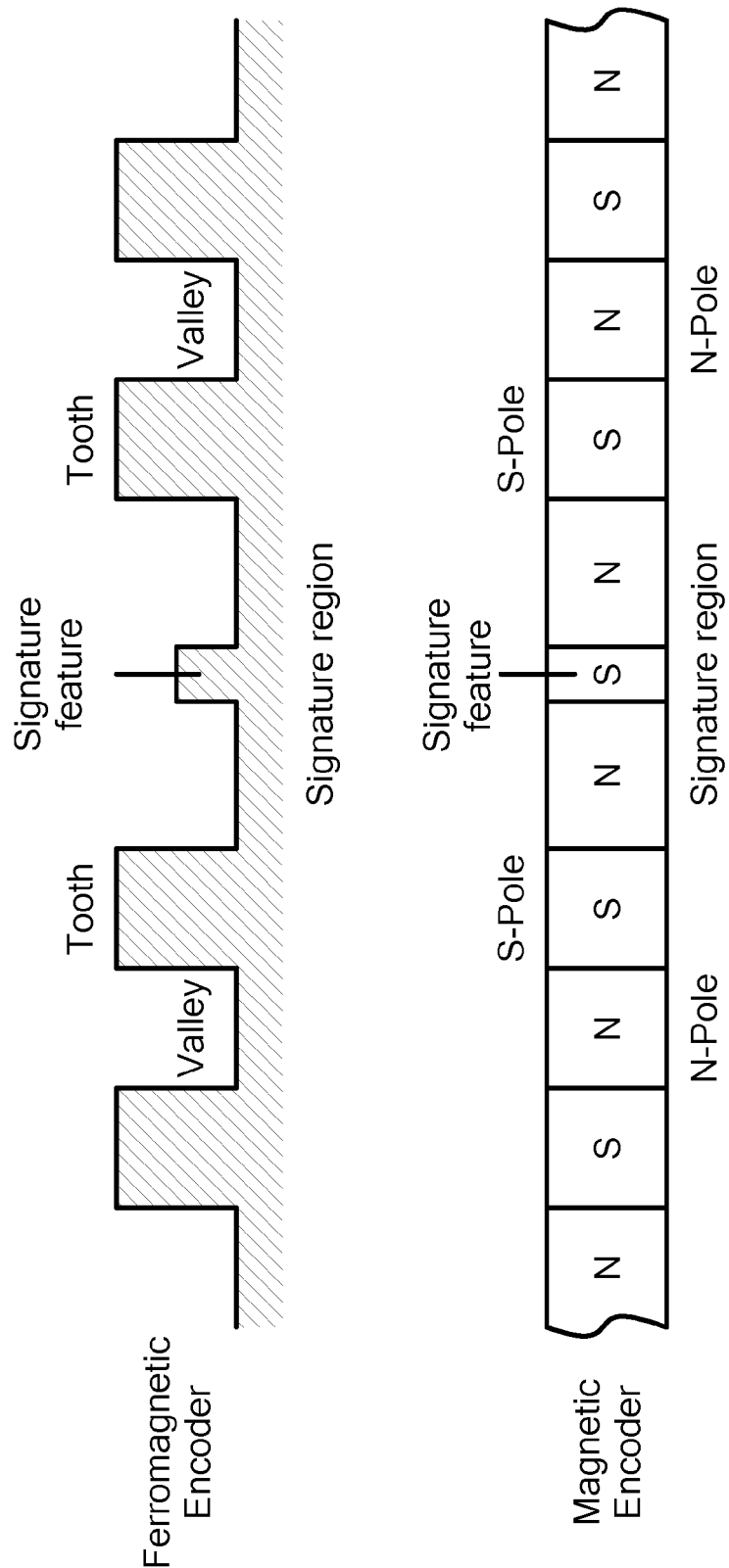
FIG. 1 is a pictorial showing two target objects, one a ferromagnetic target having teeth and having a signature feature (or region) and the other a magnetic target object having alternating north and south poles with a signature feature (or region)

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Exemplary ferromagnetic encoders (e.g., gears or ring magnets, each referred to herein as targets or target objects) used in automotive crankshaft applications may have a regular pattern of 60 teeth and valleys around the circumference of the ferromagnetic encoder wheel, with a synchronization area called a signature region (or signature feature), which can be provided, for example, as one missing tooth (60−1 target, meaning sixty minus one), two missing teeth (60−2 target), one missing valley (60+1 target) or two missing valleys (60+2 target). The same applies for magnetic encoders (e.g., ring magnets), except that teeth/valleys are replaced with North/South poles magnetized around the circumference of the magnetic encoder wheel.

In one embodiment each north/south pole pair spans six degrees, except for the signature region which may have span twelve degrees for a 60−1 or 60+1 target, or eighteen degrees for a 60−2 or 60+2 target. This concept is valid for targets with any number of switching features spanning any number of degrees and that have one or more signature regions. Furthermore, the signature region does not have to be (or span) an integer multiple of the standard switching feature size (or span).

Crankshaft magnetic field sensors (or simply sensors) that provide speed information (i.e., a speed sensor) typically switch in the middle of every tooth and valley, or alternatively, in the middle of every north and south pole. On a 60−1 or 60+1 target, the sensor will, therefore, also switch from high to low (or from low to high depending on the sensor polarity) in the middle of the signature region. Some applications use this pulse to have information from the sensor every six degrees and to detect the signature region at the same time.

Crankshaft sensors that provide both speed and direction information (i.e., a direction sensor) typically output a pulse only in the middle of the teeth (or valleys, depending on the sensor polarity), or alternatively, in the middle of north poles (or south poles, depending on the sensor polarity). On a 60−1 or 60+1 target, the conventional direction sensor does not output a pulse in the middle of the signature region. However some applications would desire that the direction (e.g., crankshaft) sensor outputs a pulse in the signature region, e.g. in next generation engines in order to have information from the sensor every six degrees and to recognize the signature region.

Described below are different embodiments for next generation direction (e.g., crankshaft) sensors, some of which output an additional pulse in the signature region of a 60−1 or 60+1 target, and some of which output a pulse with dedicated codification at the place of a normal pulse to indicates that the signature region has been crossed and detected. The concepts can be extended to larger signature regions (e.g. 60−2 or 60+2 targets). The concepts can be further extended to targets with fewer then or more than sixty teeth and valleys, or alternatively, with fewer then or more than sixty north and south poles.

In other embodiments, the teeth, or ferromagnetic regions defining the north and south poles, of the target may not have the same spacing. For example, in some cases, the teeth, or magnetic poles with one polarity (north or south), may be two degrees apart and the valleys, or magnetic poles with the other polarity (south or north), may be four degrees apart. In other embodiments, the valleys may be smaller than the teeth in degrees, or the poles with different polarities may have different dimensions. Other targets may have other number of teeth (or poles) than sixty described above.

Referring now to FIG. 1, in a first embodiment, a signature feature in a signature region upon a target object (ferromagnetic encoder or magnetic encoder) can be detected by a magnetic field sensor or an equivalent method used in a processor (or a circuit) to generate a specific signature pulse (SP) at that position (e.g. a 22.5 us signature pulse if a normal forward pulse is 45 us and a normal reverse pulse is 90 us). For a ferromagnetic target (ferromagnetic encoder), a small tooth (or a notch) can be added as shown. The shape of this tooth (or notch) can be optimized in order for the magnetic field sensor to differentiate the signature tooth (or notch) from the standard teeth and valleys. For a magnetic target (magnetic encoder), a small pole of inverse polarity can be magnetized in the signature region.

Aspects of signature pulses in an output signal from a magnetic field sensor described below in conjunction with FIGS. 2-4 apply also to FIG. 1.

While only a ferromagnetic target (encoder) is shown below in FIGS. 2-5 below, it should be understood that a magnetic target (encoder) such as that shown in FIG. 1 can instead be used with the circuits and techniques described below in conjunction with FIGS. 2-5. Furthermore, it should be understood that signals shown below in conjunction with FIGS. 2-4 as generated in conjunction with a ferromagnetic target, can instead be generated in conjunction with a magnetic target.

Figure 2:
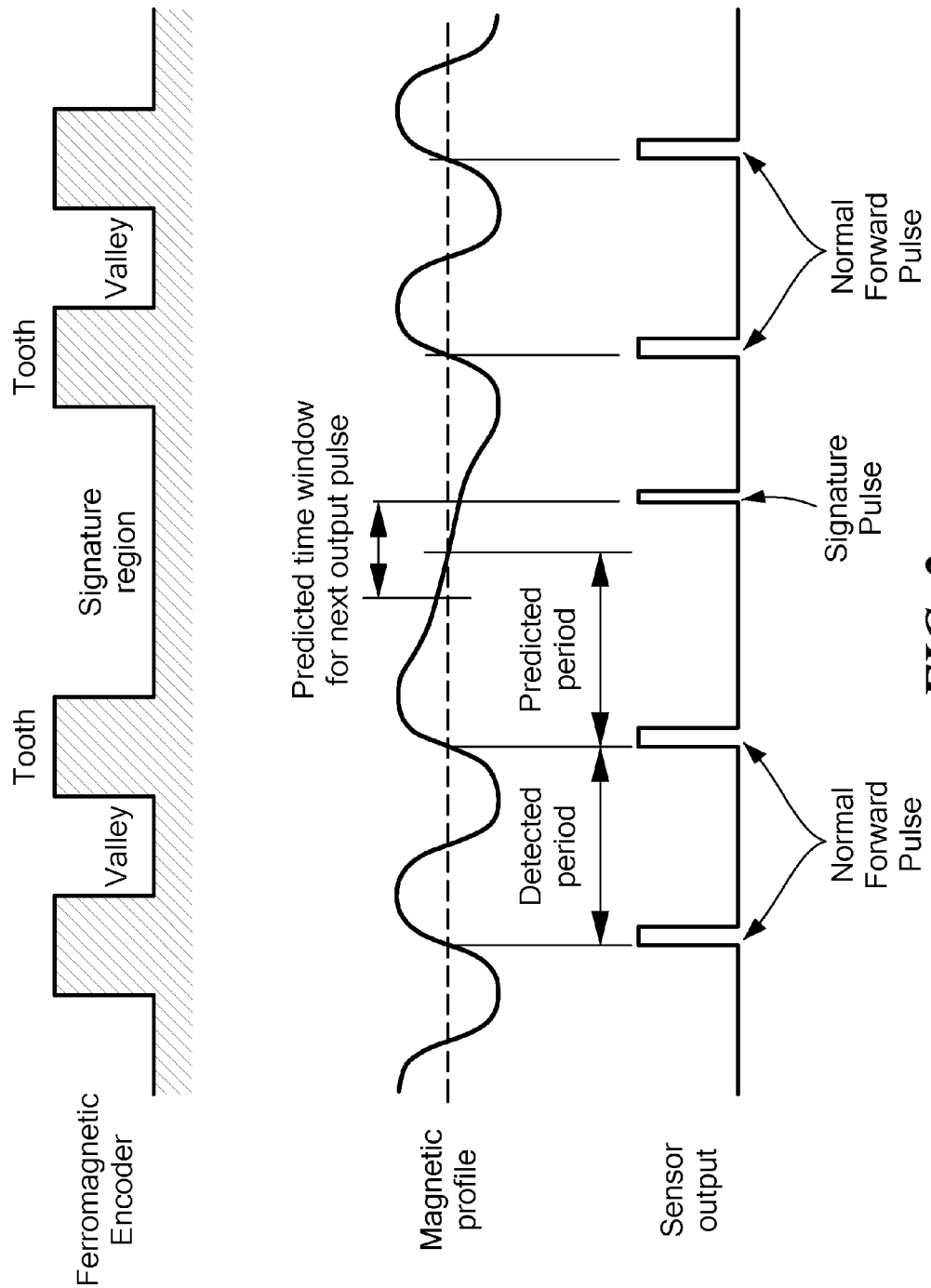
FIG. 2 is a pictorial showing a ferromagnetic target object having teeth and having another signature feature (or region), a graph of a magnetic field signal generated in a magnetic field sensor when sensing movement of the ferromagnetic target object, and a sensor output signal having pulses, and, in particular, having signature pulses indicative of the signature feature.

Referring now to FIG. 2, in a second embodiment, a magnetic field sensor or an equivalent method used in a processor (or a circuit) can be implemented to detect target speed on one (or more) pulse(s). Acceleration can also be calculated for more accuracy. This information can be used to predict the position of a next output pulse. The method or the circuit can define a time window in which the next output pulse should occur. If the output pulse does not occur in that time window, the sensor (or method) will output a specific signature pulse SP as soon as the time window is elapsed.

A magnetic profile as shown can be representative of a signal in one channel of a direction magnetic field sensor when sensing teeth and valleys of the indicated ferromagnetic encoder. A signal representative of the magnetic profile is referred to herein as a magnetic field signal.

For a direction sensor, in the case where the target begins to rotate in the opposite direction immediately before the SP has occurred, the SP may be output due to the elapse of a predicted time window shown. In this case it is permissible to output the SP even though it may not be in the same location in terms of target angle of the expected SP. The direction detection method or circuit can determine that a direction change has occurred and can follow the SP with a pulse having a pulse width indicating the opposite direction of rotation. For example, in some embodiments of the arrangements of FIGS. 1-5 herein, the normal forward direction pulses have pulse widths of about forty-five microseconds, the normal reverse direction pulses have pulse widths of about ninety microseconds, and the signature region pulses have pulse widths of about 22.5 microseconds. However, in other embodiments, any other distinguishable pulse widths can be used.

In some embodiments, the predicted time window has a time width approximately fifty percent of a period between pulses for a target rotating at a maximum expected speed. In other embodiments, the predicted time window has a time width approximately ten, twenty, thirty, forty, sixty, seventy, eighty, or ninety percent of a period between pulses for a target rotating at a maximum expected speed. In some other embodiments, the predicted time window has a time width of approximately one hundred microseconds, one hundred fifty microseconds, or two hundred microseconds.

If the method or the circuit determines that the direction of the target has changed during the predicted time window, the SP can be withheld and the normal direction detection method or circuit can output a pulse with a pulse width (e.g., ninety microseconds) indicating the change of direction.

In an embodiment related to the second embodiment, the method or the circuit learns where to expect the signature region, and based on the time intervals between the pulses leading up to the signature region, it outputs the signature pulses at predicted times. However, the signature pulses may not occur at exactly the right target angle based on acceleration or deceleration of the target after the exact predicted time has been calculated.

Figure 3:
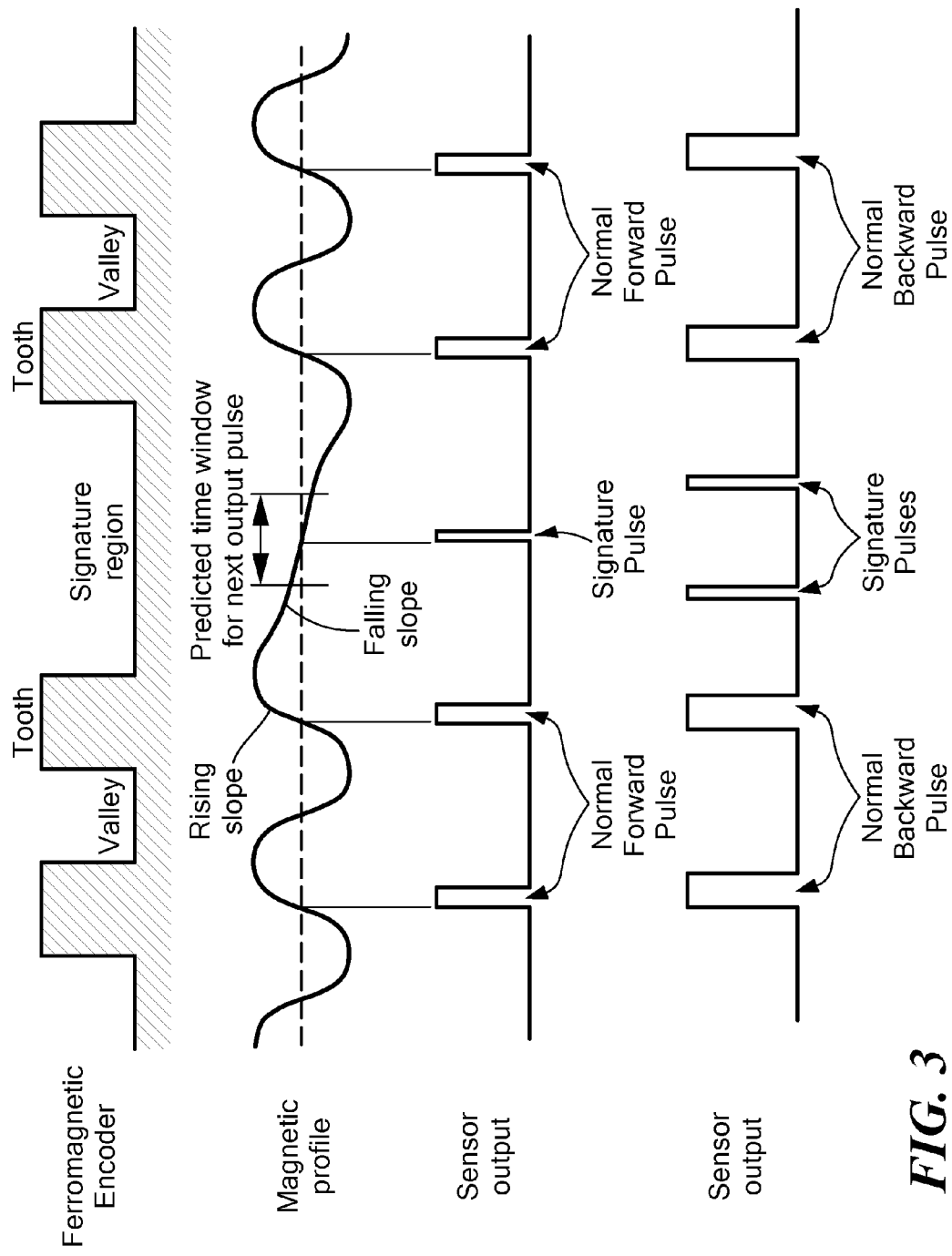
FIG. 3 is a pictorial showing the ferromagnetic target object of FIG. 2, the graph of FIG. 2, and sensor output signals having pulses, and, in particular, having one signature pulse indicative of the signature feature, and in an embodiment, having two signature pulses indicative of the signature feature.

Referring now to FIG. 3, in a third embodiment, in addition to the method or the circuit described in conjunction with FIG. 2, a zero-crossing method or circuit can be implemented that provides information on the position of every tooth and valley. In crankshaft applications, the magnetic field sensor typically outputs a pulse associated with every tooth of a target object. If in normal rotation the pulses are generated on the rising slope, a threshold crossing (e.g., a zero crossing) on the falling slope within the predicted time window can be recognized as indicative of a signature region and a specific signature pulse SP can be sent to the output upon detection of the zero crossing. Conversely, if in normal rotation the pulses are generated on the falling slope, a threshold crossing (e.g., a zero crossing) on the rising slope within the predicted time window can be recognized as indicative of a signature region.

Figure 5:
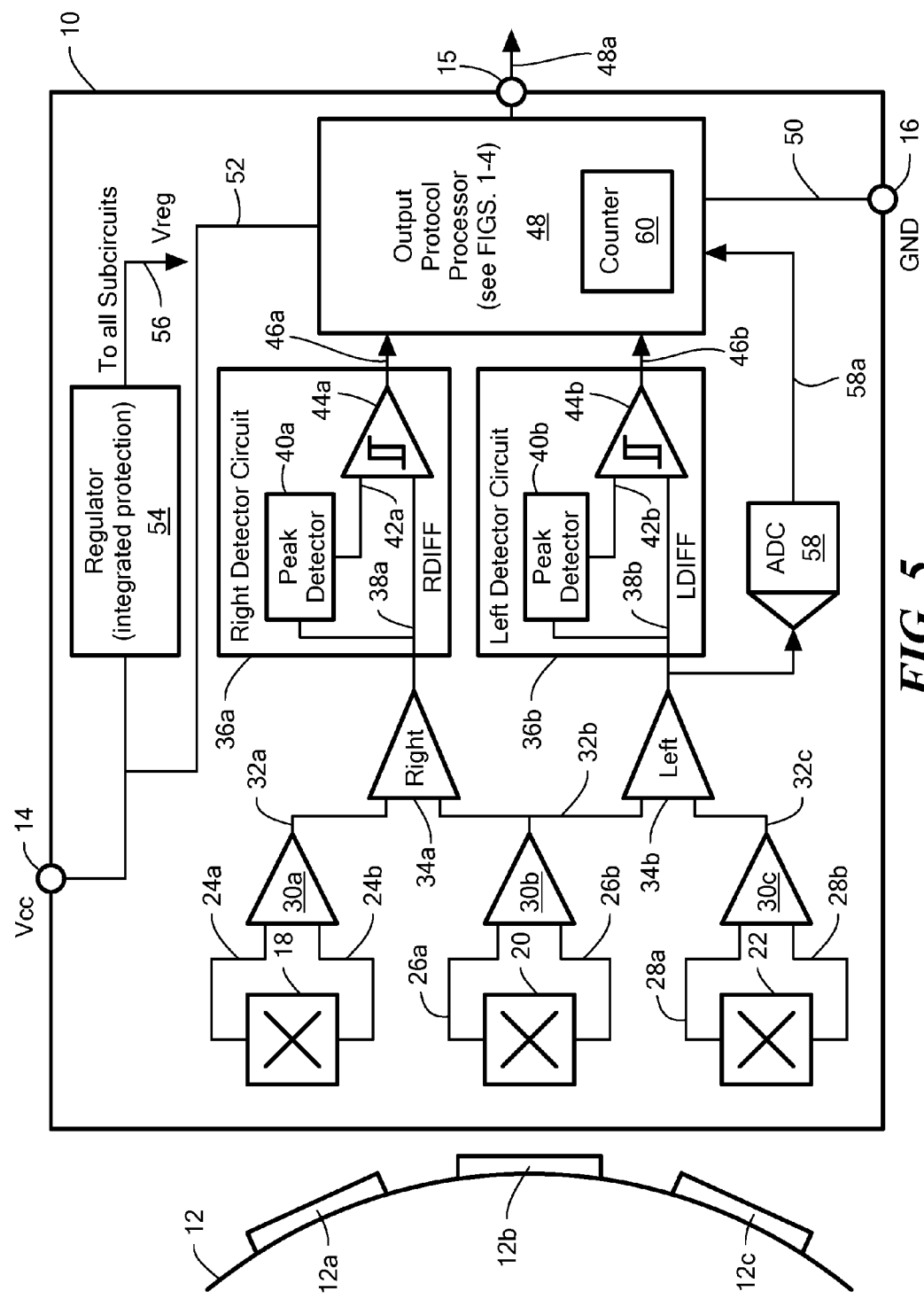
FIG. 5 is a block diagram showing a magnetic field sensor having two detector circuits for receiving the magnetic field signals of FIGS. 2-4, and having an output protocol processor for generating the sensor output signals of FIGS. 2-4.

In an embodiment related to the second and third embodiments, crankshaft sensors with direction detection typically use two phase shifted differential (DIFF) channels (i.e., two magnetic field signals, i.e., DIFF signals) to detect direction (see, e.g., FIG. 5). Normally, when not in the presence of a signature region, the two DIFF signals tend to have a known or predetermined phase separation. However, in the signature region, the phase separation between the two DIFF signals can be at less than the predetermined phase separation, or close to zero phase separation, due to the somewhat flat magnetic region shown in the. A phase detection method or circuit can be used in combination with embodiments 2 or embodiment 3 to output a specific signature pulse SP in the signature region.

Figure 4:
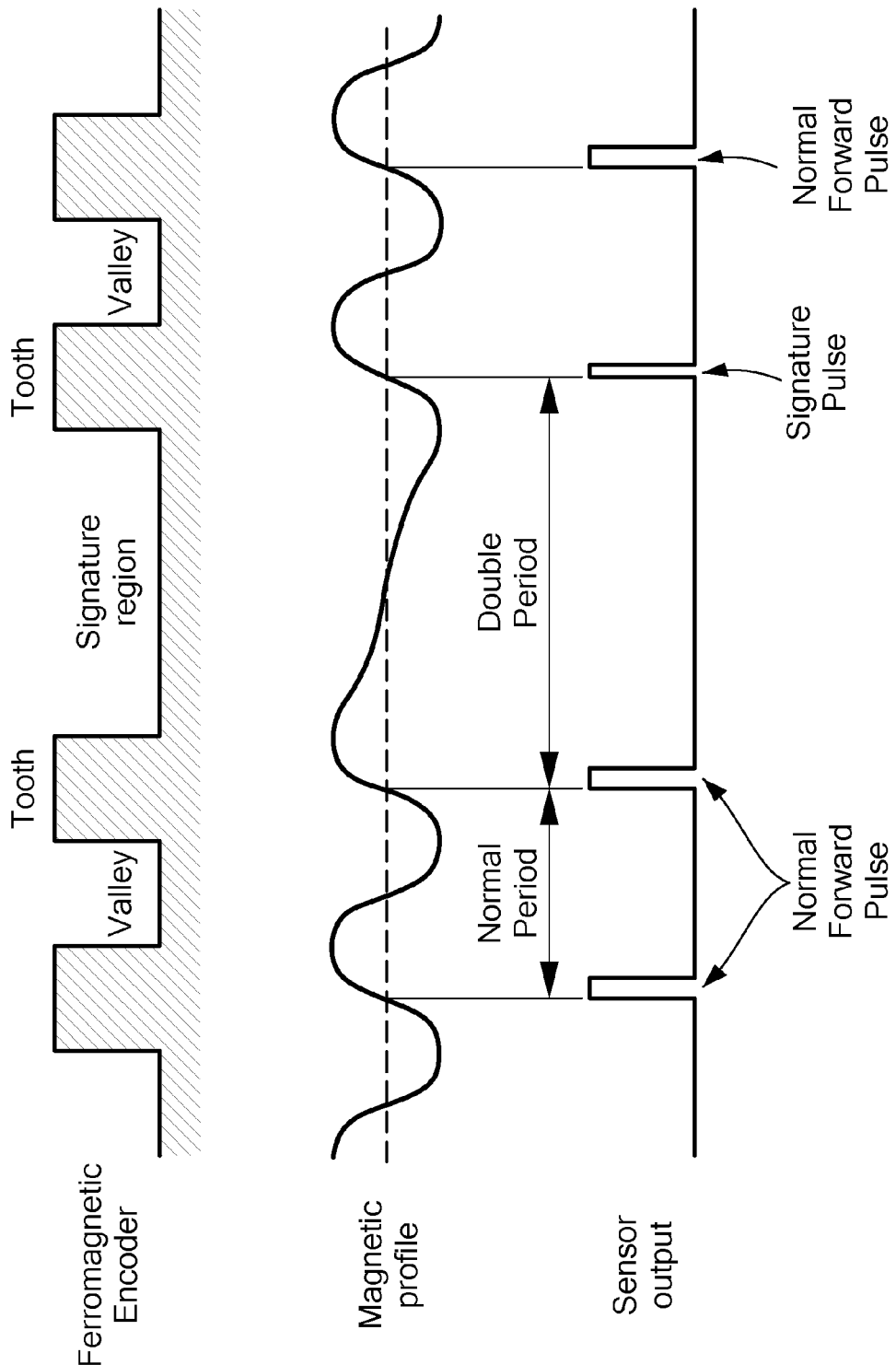
FIG. 4 is a pictorial showing the ferromagnetic target object of FIG. 2, the graph of FIG. 2, and yet another sensor output signal having pulses, and, in particular, having still other signature pulses indicative of the signature feature.

Referring now to FIG. 4, in a fourth embodiment, as in the second embodiment, a method or a circuit can be implemented to detect target speed on one (or more) pulse(s). Acceleration can also be calculated for more accuracy. The method or the circuit detects the signature region when the detected period is about double that of the previous period. A specific signature pulse SP is output on the first tooth after the signature region. This option doesn't output a pulse in the middle of the signature region but still allows for engine synchronization once per target revolution. One advantage of this embodiment is that the signature pulse SP has optimized accuracy as it corresponds to a region of steep slope on the magnetic profile, like all other output pulses. Another advantage is that the number of pulses over one revolution remains the same as that of systems in use today, thus providing backward compatibility.

For all embodiments described above, an internal counter (e.g., 60, FIG. 5 below) can be used to count the number of normal pulses between two or more signature pulses SP. This diagnostics feature can be used to validate that no pulses were missed, thus providing a level of Automotive Safety Integrity Level (ASIL) compliance that is not achieved with conventional sensors today. In some embodiments, the above described output signals (48a, 50, 52) from the magnetic field sensor 10 of FIG. 5 can include not only first (forward rotation), second (reverse rotation), and third (signature region) types of pulses, but can also indicate a failure (e.g., a wrong count), for example, with a fourth type of pulse having a fourth pulse width. For another example, upon the failure, the magnetic field sensor 10 can generate any other type of output signal, including, but not limited to, a blank output signal.

The Automotive Safety Integrity Level (ASIL) is generally applicable to safety levels in safety critical applications in autmobiles.

A particular type of endoding of the pulse associated with the signature region is shown, namely, a pulse having a shorter SP pulse width (e.g., 22.5 us), than other ones of the pulses associated with gear teeth or magnetic regions (e.g., 45 us and 90 us). In the above example, it will be recognized that the pulse associated with the signature region is half as long as the shortest pulse associated with the gear teeth or magnetic regions. However, other encodings can be used.

For example, in some other embodiments, the pulse associated with the signature region has a pulse width less than half that of the shortest pulse associated with the gear teeth or magnetic regions.

In some other embodiments, the pulse associated with the signature region has a pulse width greater than half that of the shortest pulse associated with the gear teeth or magnetic regions.

In some other embodiments, the pulse associated with the signature region has a pulse width greater than that of the shortest pulse associated with the gear teeth or magnetic regions.

In some other embodiments, the pulse associated with the signature region has a pulse width between that of the shortest and longest pulses associated with the gear teeth or magnetic regions.

In some other embodiments, the pulse associated with the signature region has a pulse width greater than the longest pulse associated with the gear teeth or magnetic regions.

In some other embodiments, the encoding associated with the signature region is provided as two or more adjacent pulses having equal pulse widths equal to, longer, shorter, or between the pulse widths associated with the gear teeth or magnetic regions.

In some other embodiments, the encoding associated with the signature region is provided as two or more adjacent pulses having unequal pulse widths equal to, longer, shorter or between the pulse widths associated with the gear teeth or magnetic regions.

All of the above embodiments provide encodings having one or more identifiable pulses associated with the signature region that can identify passing of the signature region.

While reference is made above to individual signature pulses, it will be understood that the signature region can occur at each rotation of a rotating object and a signature pulse can be generated at each occurrence of the signature region.

Referring to FIG. 5, an exemplary magnetic field sensor in the form of a rotation detector 10 can be used, for example, to detect passing gear teeth, for example, gear teeth 12a-12c of a ferromagnetic gear 12. The exemplary magnetic field sensor in FIG. 5 uses some analog circuitry to control switching on the output of the sensor, based on a magnetic input signal. In other embodiments, some of the analog functions shown could also be achieved using digital signal processing (not explicitly shown in FIG. 5).

One of ordinary skill in the art will understand that a permanent magnet (not shown) can be placed at a variety of positions proximate to the gear 12, resulting in fluctuations of a magnetic field proximate to the gear 12 as the gear 12 having the gear teeth 12a-12c rotates.

The rotation detector 10 can have a first port 14 coupled to a power supply denoted as Vcc. The rotation detector 10 can also have a second port 16 coupled to a fixed voltage source, for example, a ground voltage source, denoted as GND. Thus, in some arrangements, the rotation detector 10 is a two port device, for which an output signal appears as a signal current at the first port 14, superimposed upon the power supply voltage, Vcc, or at the second port 16, superimposed upon the ground voltage. However, in other arrangements, one of ordinary skill in the art will understand that a rotation detector similar to the rotation detector 10 can have a third port 15 at which an output signal 48a can appear as a voltage rather than a current.

The rotation detector 10 can include first, second, and third magnetic field sensing elements 18, 20, 22, respectively, here shown to be Hall Effect elements. The first Hall effect element 18 generates a first differential voltage signal 24a, 24b, the second Hall effect element 20 generates a second differential voltage signal 26a, 26b, and the third Hall effect element 22 generates a third differential voltage signal 28a, 28b, each having an AC signal component in response to the rotating gear 12.

While each one of the Hall effect elements 18, 20, 22 is shown to be a two port device, one of ordinary skill in the art will understand that each one of the Hall effect elements 18, 20, 22 is actually a four port device and the other two ports of the Hall effect elements can be coupled to receive and pass respective currents as might be provided, for example, by respective current sources or a voltage source (not shown).

The first differential voltage signal 24a, 24b is received by a first differential preamplifier 30a, the second differential voltage signal 26a, 26b is received by a second differential preamplifier 30b, and the third differential voltage signal 28a, 28b is received by a third differential preamplifier 30c.

First and second output signals 32a, 32b generated by the first and second differential preamplifiers 30a, 30b, respectively, are received by a "right" channel amplifier 34a and the second output signal 32b and a third output signals 32c generated by the second and third differential preamplifiers 30b, 30c, respectively, are received by a "left" channel amplifier 34b. Designations of "right" and "left" are arbitrary but are generally indicative of rotation of the gear 12 in first and second directions.

A signal 38a generated by the right channel amplifier 34a is received by a right channel detector circuit 36a and a signal 38b generated by the left channel amplifier 34b is received by a left channel detector circuit 36b. The signals 38a, 38b can be analog signals, generally sinusoidal in nature. Magnetic field signals to which reference is made above and which are shown in FIGS. 2-4 can correspond to the signals 38a, 38b when the target 12 includes a signature region. As described above, in some embodiments, the signals 38a, 38b can be converted to the digital domain by analog-to-digital converters or the like and the detector circuits 36a, 36b can instead be digital circuits.

Taking the right channel detector circuit 36a as representative of both of the detector circuits 36a, 36b, the right channel detector circuit 36a includes a peak detector circuit 40a coupled to receive the signal 38a. The peak detector circuit 40a is configured to detect positive and negative peaks of the signal 38a and to generate the threshold signal 42a that, for example, takes on a first threshold value just below a positive peak of the signal 38a or a second threshold value just above a negative peak of the signal 38a, depending upon a direction of transition of the signal 38a. A comparator 44a is coupled to receive the threshold signal 42a and is also coupled to receive the signal 38a. As a result, the comparator 44a generates a binary signal 46a that has transitions when the signal 38a crosses both the first and second static thresholds, near to a time when the signal 38a achieves positive and negative peaks.

For example, referring to FIGS. 6A and 6B, distinct phase differences 610 and 620 of signals (e.g., signals 46a and 46b) from right and left detector outputs (e.g., from detector circuits 36a and 36b) are shown for forward and reverse directions, respectively, such that the detector circuits can be operated to detect the forward and reverse directions (e.g., with Output Protocol Processor 48). It should be recognized that the phase differences 610, 620 have different polarities, i.e., one positive and one negative. Distinct pulse widths 615 and 625, relative to and indicative of different (faster and slower) target object rotation speeds, are shown from detector outputs (e.g., from detector circuits 36a and 36b), such that the detector circuits can be operated to detect the object rotation speeds (e.g., with Output Protocol Processor 48).

A signal 46b generated by the left channel detector circuit 36b is generated in the same way as the signal 46a. However, since the magnetic field sensing elements 18, 20 contribute to the signal 46a, while the magnetic field sensing elements 20, 22 contribute to the signal 46b, it should be appreciated that the signals 46a, 46b have edges that differ in time (which is equivalent to phase for a particular signal frequency, i.e., particular rotation speed). Furthermore, it should be appreciated that a direction of rotation of the gear 12 may be determined from a relative phase or relative time difference (e.g., lag or lead) of a particular edge transition in the signal 46a compared with a particular corresponding edge transition in the signal 46b. Therefore, a relative lag or a lead of edges of the signals 46a, 46b can be used to identify a direction of rotation of the gear 12.

The rotation detector 10 can include an output protocol circuit 48 coupled to receive and process the signals 46a, 46b and configured to generate an output signal 52 as a current signal, which is indicative of the speed of rotation and the direction of rotation of the gear 12.

While the rotation detector 10 is shown to include the detector circuits 36a, 36b, each having a particular topology, it should be understood that any form of peak-referenced detectors or peak-to-peak percentage detectors, including, but not limited to, the above-described peak-referenced detectors and peak-to-peak percentage detectors, can be used in place of or in addition to the detector circuits 36a, 36b.

While the gear (i.e., target) 12 is not shown to include a signature region, it will be understood that the gear 12 can have a signature region. It will also be understood that the gear 12 can be replaced by a ring magnet with a signature region.

The rotation detector 10, i.e., the output protocol processor 48, is configured to generate an output signal 52 (or 50) and/or 48a having one or more of the signal formats described above in conjunction with FIGS. 1-4. In some other embodiments, the processor 48 can be replaced in full or in part with a different type of electronic circuit, which is not part of a processor per se.

When output signals 52 or 50 are used to carry the above-described output signals, the output signals shown in FIGS. 2-4 can be current signals. When output signals 48a is used to carry the above-described output signals, the output signals shown in FIGS. 2-4 can be voltage (or current) signals.

As described above, parts of the rotation detector 10 are represented by analog circuit blocks. In other embodiments, one or more of the circuit blocks represented in analog form could instead be formed as digital circuits that do the same or similar functions.

The output protocol processor can be operable to identify the above-described predicted time window in accordance with transition edges in one of or both of the signals 46a, 46b. The output protocol processor 48 can be operable to generate the above described signature pulses having pulse widths and at times according to embodiments described above.

The output protocol processor can also generate pulses with pulse widths according to direction of the target 12.

In some embodiments described above, e.g., the third embodiment of FIG. 3, which determines a zero crossing of a magnetic field signal (e.g., 38a and/or 38b), the magnetic field sensor 10 can also include an analog-to-digital converter (ADC) 58 to provide a sampled digital signal 58a to the output protocol processor 48. The output protocol processor 48 can identify the above-described zero crossings within the sampled digital signal 58a.

While one ADC 58 is shown, on other embodiments, the magnetic field sensor 10 can include another ADC (not shown) to convert the other magnetic field signal 38a and to provide another digital sampled signal (not shown) to the output protocol processor 48.

While rotating objects are described above, in other arrangements, a magnetic field sensor and related technique can be used to sense a signature region in a ferromagnetic or magnetic target object operable to move in another fashion, for example, linearly.

U.S. Pat. No. 7,982,454, issued Jul. 19, 2011, entitled "Calibration Circuits and Methods for Proximity Detector," which is assigned to the assignee of the present invention, is incorporated by reference herein in its entirety.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that the scope of the patent should not be limited to the described embodiments but rather should be limited only by the spirit and scope of the following claims.

What is clamed is:

1. A magnetic field sensor, comprising:
   two or more magnetic field sensing elements responsive to a target capable of moving, the target having a signature region, wherein the two or more magnetic field sensing elements are configured to generate at least two magnetic field signals;
   at least two detector circuits coupled to the two or more magnetic field sensing elements, wherein the at least two detector circuits are configured to generate a respective at least two detector signals, wherein each detector signal has respective state transitions with respective rates which identify a rate of movement of the target, and wherein the state transitions of the at least two detector signals have first and second different relative phases, wherein the first and second different relative phases identify respective first and second different directions of movement of the target; and
   an output protocol processor coupled to the at least two detector circuits and configured to generate a magnetic field sensor output signal, wherein the magnetic field sensor output signal has a plurality of pulses with respective pulse widths, wherein first pulses with first pulse widths with a first time duration identify that the target is moving in the first direction, wherein second pulses with second pulse widths with a second different time duration identify that the target is moving in the second different direction, wherein third pulses with identifiable encoding identify that the signature region is passing by the magnetic field sensor, wherein the third pulses each comprise respective state transitions and each comprise respective pulse widths with respective fixed predetermined time durations, wherein the fixed predetermined time durations are not affected by a size of the signature region, and wherein the first and second pulse widths of the first and second pulses that identify the first and second different directions do not depend upon respective duty cycles of the at least two magnetic field signals or upon respective duty cycles of the at least two detector signals.

2. The magnetic field sensor of claim 1, wherein the third pulses have third pulse widths with a third different time duration that are indicative of the signature region passing by the magnetic field sensor.

3. The magnetic field sensor of claim 1, wherein the target has at least one of a plurality of ferromagnetic teeth and a plurality of valleys, each with a respective width, or a plurality of north pole magnetic regions and a plurality of south pole magnetic regions, each with a respective width, and wherein the signature region comprises a signature structure comprised of at least one signature ferromagnetic tooth, at least one valley, at least one north pole magnetic region, or at least one south pole magnetic region, with a width different than the widths of the plurality of ferromagnetic teeth, or the widths of plurality of valleys, or the widths of the plurality of north pole magnetic regions, or the widths of the plurality of south pole magnetic regions.

4. The magnetic field sensor of claim 1, wherein positions of the third pulses within the plurality of pulses are determined according to threshold crossings of at least one of the magnetic field signals.

5. The magnetic field sensor of claim 1, wherein positions of the third pulses within the plurality of pulses are determined according to a time prediction of where one of the first pulses or one of the second pulses would occur if the signature region were not provided.

6. The magnetic field sensor of claim 1, wherein positions of the third pulses within the plurality of pulses are determined according to a position of a next one of the first pulses or a next one of the second pulses that would occur after the signature region passes by the magnetic field sensor.

7. The magnetic field sensor of claim 1, wherein the third pulses are spaced an equal distance in time between the first pulses or the second pulses and are substantially centered with respect to the signature region.

8. The magnetic field sensor of claim 1, wherein the third pulses are spaced an unequal distance in time between the first pulses or the second pulses and are not centered with respect to the signature region.

9. The magnetic field sensor of claim 1, wherein positions of the third pulses within the plurality of pulses are determined according to phase differences between two of the at least two magnetic field signals.

10. The magnetic field sensor of claim 1, further comprising a counter for counting a quantity of the first pulses or a quantity of the second pulses between two or more of the third pulses to identify a passing or a failing condition.

11. The magnetic field sensor of claim 1, wherein two of more of the third pulses are generated each time that the signature region passes by the magnetic field sensor.

12. A method used in a magnetic field sensor, comprising:
    generating at least two magnetic field signals with two or more magnetic field sensing elements responsive to a target capable of moving, the target having a signature region;
    generating a respective at least two detector signals with at least two detector circuits coupled to the two or more magnetic field sensing elements, wherein each detector signal has respective state transitions with respective rates that identify a rate of movement of the target, and wherein the state transitions of the at least two detector signals have first and second different relative phases, wherein the first and second different relative phases identify respective first and second different directions of movement of the target;
    identifying the rate of movement;

identifying the first and second different directions of movement; and generating a magnetic field sensor output signal, wherein the magnetic field sensor output signal has a plurality of pulses with respective pulse widths, wherein first pulses with first pulse widths with a first time duration are indicative of the target moving in the first direction, wherein second pulses with second pulse widths with a second different time duration identify that the target is moving in the second different direction, wherein third pulses with identifiable encoding identify that the signature region is passing by the magnetic field sensor, wherein the third pulses each comprise respective state transitions and each comprise respective pulse widths with respective fixed predetermined time durations, wherein the fixed predetermined time durations are not affected by a size of the signature region, and wherein the first and second pulse widths of the first and second pulses that identify the first and second different directions do not depend upon respective duty cycles of the at least two magnetic field signals or upon respective duty cycles of the at least two detector signals.

13. The method of claim 12, wherein the third pulses have third pulse widths with a third different time duration that are indicative of the signature region passing by the magnetic field sensor.

14. The method of claim 12, wherein the target has at least one of a plurality of ferromagnetic teeth and a plurality of valleys, each with a respective width, or a plurality of north pole magnetic regions and a plurality of south pole magnetic regions, each with a respective width, and wherein the signature region comprises a signature structure comprised of at least one signature ferromagnetic tooth, at least one valley, at least one north pole magnetic region, or at least one south pole magnetic region, with a width different than widths of the plurality of ferromagnetic teeth, or the widths of plurality of valleys, or the widths of the plurality of north pole magnetic regions, or the widths of the plurality of south pole magnetic regions.

15. The method of claim 12, wherein positions of the third pulses within the plurality of pulses are determined according to threshold crossings of at least one of the magnetic field signals.

16. The method of claim 12, wherein positions of the third pulses within the plurality of pulses are determined according to a time prediction of where one of the first pulses or one of the second pulses would occur if the signature region were not provided.

17. The method of claim 12, wherein positions of the third pulses within the plurality of pulses are determined according to a position of a next one of the first pulses or a next one of the second pulses that would occur after the signature region passes by the magnetic field sensor.

18. The method of claim 12, wherein the third pulses are spaced an equal distance in time between the first pulses or the second pulses and are substantially centered with respect to the signature region.

19. The method of claim 12, wherein the third pulses are spaced an unequal distance in time between the first pulses or the second pulses and are not centered with respect to the signature region.

20. The method of claim 12, wherein positions of the third pulses within the plurality of pulses are determined according to phase differences between two of the at least two magnetic field signals.

21. The method of claim 12, further comprising:
counting a quantity of the first pulses or a quantity of the second pulses between two or more of the third pulses; and
identifying a passing or a failing condition in accordance with the counted quantity.

22. The method of claim 12, wherein the generating the magnetic field sensor output signal comprises generating two of more of the third pulses each time that the signature region passes by the magnetic field sensor.

* * * * *

UNITED STATES PATENT AND TRADEMARK OFFICE
CERTIFICATE OF CORRECTION

PATENT NO. : 9,664,748 B2
APPLICATION NO. : 14/306722
DATED : May 30, 2017
INVENTOR(S) : Andreas P. Friedrich et al.

It is certified that error appears in the above-identified patent and that said Letters Patent is hereby corrected as shown below:

In the Specification

Column 2, Line 57, delete "is a" and replace with --in a--.

Column 3, Line 11, delete "signal," and replace with --signal.--.

Column 3, Line 38, delete "of plurality" and replace with --of the plurality--.

Column 4, Line 49, delete "of plurality" and replace with --of the plurality--.

Column 7, Line 26, delete "indicates" and replace with --indicate--.

Column 7, Line 41, delete "number" and replace with --numbers--.

Column 7, Line 60, delete "below in FIGS. 2-5 below, it" and replace with --in FIGS. 2-5 below, it--.

Column 8, Line 37, delete "forty, sixty," and replace with --forty, fifty, sixty,--.

Column 9, Line 13, delete "can be at less" and replace with --can be less--.

Column 9, Line 16, delete "shown in the." and replace with --shown.--.

Column 9, Line 17, delete "embodiments 2" and replace with --embodiment 2--.

Column 9, Line 55, delete "autmobiles." and replace with --automobiles--.

Column 9, Line 56, delete "endoding" and replace with --encoding--.

Column 11, Line 20, delete "signals 32*c*" and replace with --signal 32*c*--.

Signed and Sealed this
Twenty-seventh Day of November, 2018

Andrei Iancu
*Director of the United States Patent and Trademark Office*

Column 12, Line 44, delete "signals 48*a*" and replace with --signal 48*a*--.

Column 12, Line 58, delete "widths and at times according" and replace with --widths according--.

In the Claims

Column 14, Line 15, delete "of plurality" and replace with --of the plurality--.

Column 14, Line 48, delete "two of" and replace with --two or--.

Column 16, Line 1, delete "of plurality" and replace with --of the plurality--.

Column 16, Line 37, delete "two of" and replace with --two or--.